(12) United States Patent
Kimura et al.

(10) Patent No.: US 11,215,526 B2
(45) Date of Patent: Jan. 4, 2022

(54) INSPECTION APPARATUS AND INSPECTION METHOD

(71) Applicant: SONY SEMICONDUCTOR SOLUTIONS CORPORATION, Kanagawa (JP)

(72) Inventors: Katsuji Kimura, Kanagawa (JP); Hiroyuki Yamanaka, Kumamoto (JP); Yuji Furukawa, Kumamoto (JP); Kohei Harada, Kumamoto (JP); Hironori Takahashi, Kumamoto (JP); Hiroyuki Goto, Nagasaki (JP); Heiichiro Ryu, Kumamoto (JP); Katsuaki Tatebayashi, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/650,935

(22) PCT Filed: Sep. 20, 2018

(86) PCT No.: PCT/JP2018/034730
§ 371 (c)(1),
(2) Date: Mar. 26, 2020

(87) PCT Pub. No.: WO2019/069693
PCT Pub. Date: Apr. 11, 2019

(65) Prior Publication Data
US 2020/0292414 A1 Sep. 17, 2020

(30) Foreign Application Priority Data
Oct. 4, 2017 (JP) .............................. JP2017-194477

(51) Int. Cl.
*G01M 11/02* (2006.01)
*G01N 21/88* (2006.01)
(Continued)

(52) U.S. Cl.
CPC ...... *G01M 11/0257* (2013.01); *G01M 11/025* (2013.01); *G01M 11/0207* (2013.01);
(Continued)

(58) Field of Classification Search
CPC .... G01J 1/0411; G01J 1/10; G01J 1/12; G01J 1/14; G01J 1/38; H01L 27/14627;
(Continued)

(56) References Cited

U.S. PATENT DOCUMENTS 6,252,216 B1    6/2001  Ohashi
7,251,576 B2 *  7/2007  Su .................... G01R 31/2641
                                                  702/116
(Continued)

FOREIGN PATENT DOCUMENTS

CN    1675977 A    9/2005
CN    1871860 A    11/2006
(Continued)

OTHER PUBLICATIONS

International Search Report and Written Opinion of PCT Application No. PCT/JP2018/034730, dated Dec. 4, 2018, 11 pages of ISRWO.
(Continued)

*Primary Examiner* — Gordon J Stock, Jr.
(74) *Attorney, Agent, or Firm* — Chip Law Group

(57) ABSTRACT

The present disclosure relates to an inspection apparatus and an inspection method that enable inspection of the performance of an image pickup element. Generation of collimated light and transmission of part of the collimated light through a transmission filter having a light-blocking face
(Continued)

provided with circular holes arranged regularly, causes conversion to rays of columnar collimated light arranged regularly. An image including the rays of columnar collimated light arranged regularly, is captured by an image pickup element being inspected. Then, acquisition of the difference between the image captured by the image pickup element being inspected and an ideal image captured by an ideal image pickup element and comparison between the difference and a threshold, result in inspection of the performance of the image pickup element being inspected.

15 Claims, 14 Drawing Sheets

(51) Int. Cl.
  *G01R 31/28* (2006.01)
  *G01R 31/26* (2020.01)
  *G01R 31/311* (2006.01)

(52) U.S. Cl.
  CPC ..... *G01N 21/8806* (2013.01); *G01R 31/2641* (2013.01); *G01R 31/2829* (2013.01); *G01R 31/311* (2013.01)

(58) Field of Classification Search
  CPC ............ G01M 11/02; G01M 11/0207; G01M 11/0214; G01M 11/0221; G01M 11/0228; G01M 11/0235; G01M 11/0242; G01M 11/0257; G01M 11/0264; G01M 11/0278; G01M 11/08; G01M 11/081; G02B 5/00; G02B 5/003; G02B 5/20; G01N 21/88; G01N 21/8806; G01N 21/8851; G01N 21/956; G01N 21/95607; G01N 21/958; G01N 2021/9583; G01N 2021/95615; G01B 11/16; G01B 11/24; G01R 31/26; G01R 31/265; G01R 31/2656; G01R 31/282; G01R 31/2829; G01R 31/2832; G01R 31/2836; G01R 31/2851; G01R 31/2886; G01R 31/2887; G01R 31/2889; G01R 31/2896; G01R 31/302; G01R 31/303; G01R 31/308; G01R 31/309; G01R 31/311
  See application file for complete search history.

(56) References Cited

U.S. PATENT DOCUMENTS

| | | | | |
|---|---|---|---|---|
| 7,400,389 | B2* | 7/2008 | Gomm | H04N 17/002 348/E17.002 |
| 7,868,630 | B2* | 1/2011 | Caldwell | G01R 31/311 324/754.23 |
| 8,000,520 | B2* | 8/2011 | Chang | H04N 17/002 382/149 |
| 8,358,146 | B2* | 1/2013 | Hung | G01R 31/311 324/754.03 |
| 9,040,896 | B2* | 5/2015 | Walker | G01J 1/0451 250/208.2 |
| 10,352,870 | B2* | 7/2019 | Kawamata | G01J 1/32 |
| 10,775,413 | B2* | 9/2020 | Jen | G01R 31/311 |
| 2007/0268483 | A1* | 11/2007 | Yatsugake | G01N 21/84 356/237.1 |
| 2014/0145745 | A1* | 5/2014 | Ryu | G01R 31/2889 324/762.01 |
| 2017/0023614 | A1 | 1/2017 | Jen et al. | |
| 2018/0211989 | A1 | 7/2018 | Hogyoku et al. | |

FOREIGN PATENT DOCUMENTS

| | | |
|---|---|---|
| CN | 102036023 A | 4/2011 |
| CN | 102128678 A | 7/2011 |
| CN | 103513062 A | 1/2014 |
| CN | 104980734 A | 10/2015 |
| CN | 107851651 A | 3/2018 |
| JP | 06-244396 A | 9/1994 |
| JP | 07-147309 A | 6/1995 |
| JP | 08-292128 A | 11/1996 |
| JP | 11-087671 A | 3/1999 |
| JP | 2006-058313 A | 3/2006 |
| JP | 2008-196916 A | 8/2008 |
| JP | 2012-063220 A | 3/2012 |
| JP | 2018-110302 A | 7/2018 |
| WO | 2017/014072 A1 | 1/2017 |
| WO | 2018/123643 A1 | 7/2018 |

OTHER PUBLICATIONS

Office Action for CN Patent Application No. 201880063052.X, dated Sep. 3, 2021, 10 pages of English Translation and 06 pages of Office Action.

* cited by examiner

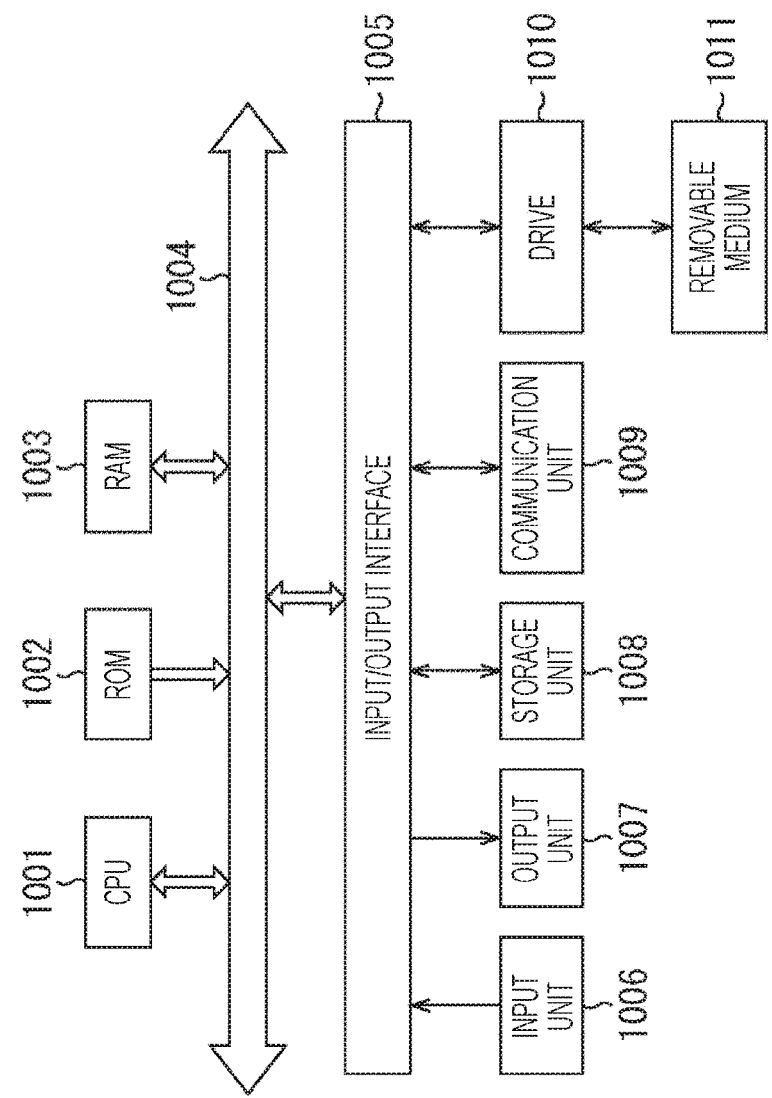

INSPECTION APPARATUS AND INSPECTION METHOD

CROSS REFERENCE TO RELATED APPLICATIONS

This application is a U.S. National Phase of International Patent Application No. PCT/JP2018/034730 filed on Sep. 20, 2018, which claims priority benefit of Japanese Patent Application No. JP 2017-194477 filed in the Japan Patent Office on Oct. 4, 2017. Each of the above-referenced applications is hereby incorporated herein by reference in its entirety.

TECHNICAL FIELD

The present disclosure relates to an inspection apparatus and an inspection method, and a program, and particularly relates to an inspection apparatus and an inspection method, and a program that enable inspection of the shape of a lens mounted on a solid-state image pickup element or inspection of a glass face on a solid-state image pickup element, with simplicity.

BACKGROUND ART

Recently, high pixelization, miniaturization, and profile reduction have been advanced for solid-state image pickup elements for use in camera-equipped mobile terminal devices or digital still cameras.

As a technique for miniaturization and thickness reduction, typically, a solid-state image pickup element is improved to a chip size package (CSP) solid-state image pickup element, and additionally, with a two-group configuration as a lens configuration, a lowermost lens is arranged on the CSP solid-state image pickup element.

However, it has been known that, due to the influence of thickness reduction, the CSP solid-state image pickup element warps or bends at the time of manufacturing or the formed lowermost lens deforms in shape. A solid-state image pickup device equipped with the CSP solid-state image pickup element in which a defective lens in shape is formed, is defective naturally, resulting in deterioration in yield.

Therefore, application of a technology of measuring the surface shape of a lens is considered (Patent Document 1).

CITATION LIST

Patent Document

Patent Document 1: Japanese Patent Application Laid-Open No. 2006-058313

SUMMARY OF THE INVENTION

Problems to be Solved by the Invention

Because the technology in Patent Document 1 aims at measuring the surface shape of a lens, the surface shape of one lens can be measured. However, for a CSP solid-state image pickup element on which a lens is formed, the CSP solid-state image pickup element itself inclusive of the lens is difficult to measure.

Furthermore, although a technology of measuring the shape of a lens in direct contact is available, the face of a lens mounted on a glass of a CSP solid-state image pickup element is damaged at the time of contact.

Thus, it has been known that an accurate measurement in shape is difficult to make actually by observation with a microscope, resulting in deterioration in yield at the time of manufacturing.

The present disclosure has been made in consideration of such a situation, and particularly an object of the present disclosure is to enable inspection of the shape of a lens mounted on a solid-state image pickup element or inspection of a glass face on a solid-state image pickup element, with simplicity.

Solutions to Problems

An inspection apparatus according to one aspect of the present disclosure, includes: a collimated-light generation unit configured to generate collimated light; a transmission filter configured to transmit part of the collimated light and block another part of the collimated light different from the part of the collimated light; an image pickup element configured to capture an image including the part of the collimated light transmitted by the transmission filter; and an inspection unit configured to compare the image captured by the image pickup element with an ideal image captured by an ideal image pickup element, to inspect the image pickup element.

The transmission filter can have a flat face including a light-blocking face and can have holes for allowing the collimated light to be transmitted, the holes being arranged regularly on the light-blocking face.

A plurality of the holes on the flat face including the light-blocking face of the transmission filter can be made circular, quadrangular, or triangular in shape.

The holes on the flat face including the light-blocking face of the transmission filter can be made linear in shape or can be made in a grid pattern.

The image pickup element can include: a chip size package (CSP) solid-state image pickup element configured to capture an image including a pixel signal corresponding to a quantity of incident light; and a lens configured to condense the incident light to the CSP solid-state image pickup element.

The lens can be made a lower lens that is part of a lens group of a plurality of lenses that condenses received light, is located on a front side of the image pickup element, is arranged closer to the image pickup element than an upper lens is, the upper lens being part of the lens group, and is another part of the lens group different from the part of the lens group.

The lower lens can include a plurality of lenses.

The inspection apparatus can further include: a light-absorbing material that has a function of absorbing light, and is provided to cover a side face of the image pickup element and an outer circumferential portion of the lens, in which the inspection unit can compare the image captured by the image pickup element out of an insensitive region on the image pickup element, due to condensation by the lens having the outer circumferential portion partially covered with the light-absorbing material, with the ideal image captured by the ideal image pickup element, to inspect the image pickup element.

The image pickup element can include a chip size package (CSP) solid-state image pickup element that captures an image including a pixel signal corresponding to a quantity of incident light.

The inspection apparatus can further include: a calculation unit configured to calculate a difference between the image captured by the image pickup element and the ideal image captured by the ideal image pickup element, in which the inspection unit can compare the difference calculated by the calculation unit with a predetermined threshold, to inspect the image pickup element.

The calculation unit can calculate a sum of difference absolute values in pixel value between pixels of the image captured by the image pickup element and the ideal image captured by the ideal image pickup element.

The inspection apparatus can further include: a connection that is connected with the image pickup element, and outputs the image including a pixel signal captured by the image pickup element, to the inspection unit.

The image pickup element can be connected with a circuit board of an image pickup device, and the image including a pixel signal captured by the image pickup element can be output to the inspection unit through the circuit board.

An inspection method according to one aspect of the present disclosure includes: collimated-light generation processing of generating collimated light; transmission processing of transmitting part of the collimated light and blocking another part of the collimated light different from the part of the collimated light; and inspection processing of comparing an image including the part of the collimated light transmitted by the transmission processing, captured by an image pickup element that captures the image, with an ideal image captured by an ideal image pickup element, to inspect the image pickup element.

A program according to one aspect of the present disclosure causes a computer that controls an inspection apparatus including: a collimated-light generation unit configured to generate collimated light; a transmission filter configured to transmit part of the collimated light and block another part of the collimated light different from the part of the collimated light; an image pickup element configured to capture an image including the part of the collimated light transmitted by the transmission filter; and an inspection unit configured to compare the image captured by the image pickup element with an ideal image captured by an ideal image pickup element, to inspect the image pickup element, to function as the inspection unit configured to compare the image captured by the image pickup element with the ideal image captured by the ideal image pickup element, to inspect the image pickup element.

In one aspect of the present disclosure, collimated light is generated, part of the collimated light is transmitted, an image pickup element captures an image including the part of the collimated light transmitted by a transmission filter that blocks other part of the collimated light different from the part of the collimated light, and the image captured by the image pickup element and an ideal image captured by an ideal image pickup element are compared to inspect the image pickup element.

Effects of the Invention

According to one aspect of the present disclosure, particularly, an image pickup element inclusive of the shape of a lens mounted on a solid-state image pickup element or a glass face on a solid-state image pickup element, can be inspected with simplicity.

BRIEF DESCRIPTION OF DRAWINGS

FIG. 14 explanatorily illustrates an exemplary configuration of a general-purpose personal computer.

MODE FOR CARRYING OUT THE INVENTION

Preferred embodiments of the present disclosure will be described in detail below with reference to the accompanying drawings. Note that, in the present specification and the drawings, constituent elements having substantially the same functional configurations are denoted with the same reference signs, and thus the duplicate descriptions thereof will be omitted.

Furthermore, the descriptions will be given in the following order.

1. Overview of Present Disclosure
2. First Embodiment
3. First Modification of First Embodiment
4. Second Modification of First Embodiment
5. Third Modification of First Embodiment
6. Fourth Modification of First Embodiment
7. Second Embodiment
8. Modification of Second Embodiment
9. Configuration of CSP Solid-State Image Pickup Element
10. Exemplary Carrying-Out by Software 1. Overview of Present Disclosure <Exemplary Configuration of Image Pickup Device with Image Pickup Element>

For giving an overview of the present disclosure, an exemplary configuration of an image pickup device with an image pickup element will be described.

Figure 1:
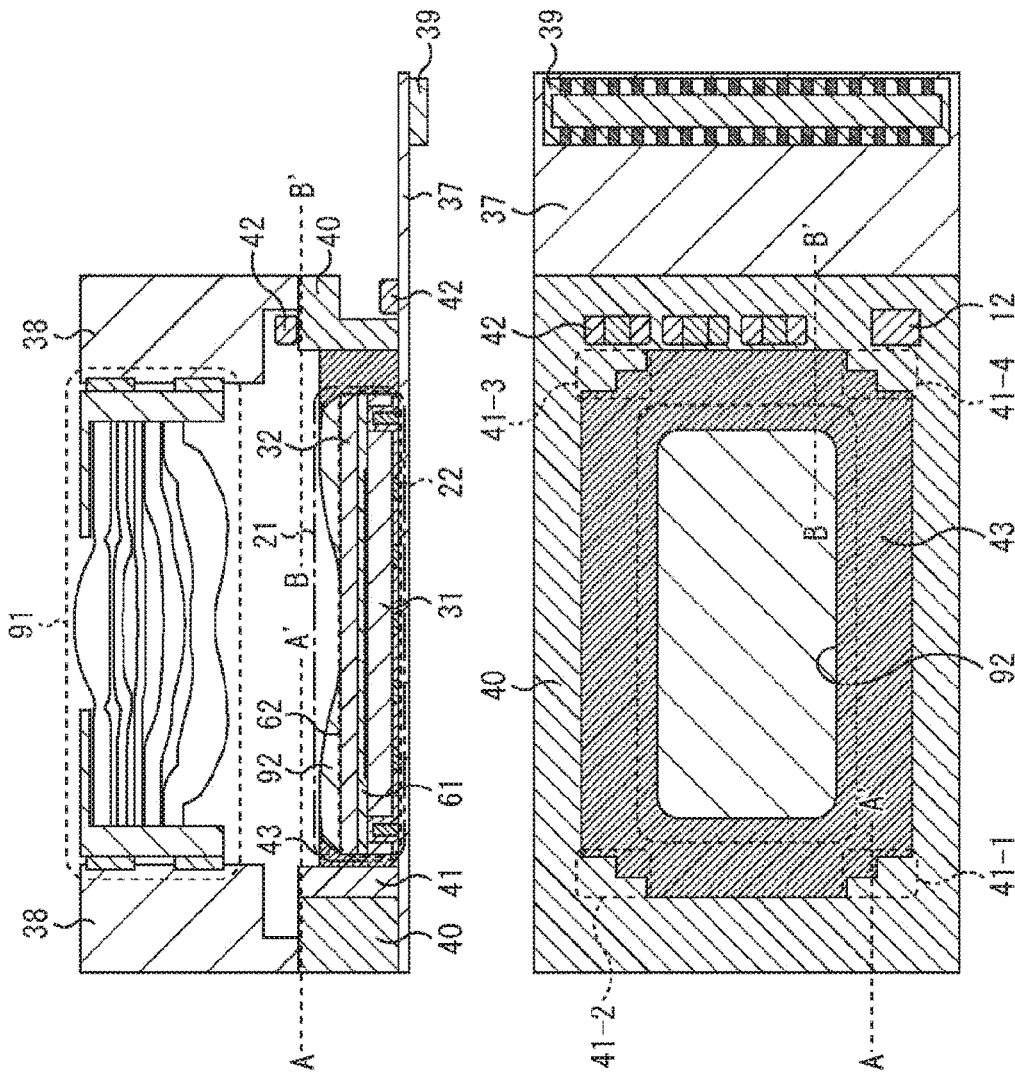
FIG. 1 explanatorily illustrates an exemplary configuration of an image pickup device equipped with an image pickup element to be inspected by an inspection apparatus according to the present disclosure.

A side sectional view of an image pickup device 11 is given on the upper side of FIG. 1. A top view of a section taken along line A-B' on the upper side of FIG. 1 is given on the lower side of FIG. 1. Note that the left half on the upper side of FIG. 1 illustrates a section taken along line A-A' on the lower side of FIG. 1, and the right half on the upper side of FIG. 1 illustrates a section taken along line B-B' on the lower side of FIG. 1.

The image pickup device 11 of FIG. 1 includes a chip size package (CSP) solid-state image pickup element (also referred to as a solid-state image pickup device) 22, a circuit board 37, an actuator 38, a spacer 40, and lenses 91 and 92. A lens in the image pickup device 11 of FIG. 1 is divided into two groups of the lenses 91 and 92. The lowermost lens 92 is arranged right above a solid-state image pickup element 31 in the direction of transmitted light from the upper lens 91.

The chip size package (CSP) solid-state image pickup element 22 of FIG. 1 has an integrated structure of the solid-state image pickup element 31 and a glass substrate 32 having an infrared cutoff filter (IRCF) function. Moreover, an image pickup element 21 has an integrated structure of the CSP solid-state image pickup element 22 and the lens 92.

More specifically, the solid-state image pickup element 31 is an image sensor including, for example, charged coupled devices (CCDs) or a complementary metal oxide semiconductor (CMOS). The solid-state image pickup element 31 photoelectrically converts incident light through the lens 9 that the lenses 91 and 92 integrally form (FIG. 7), into electric charge in accordance with the quantity of light in units of pixels, and outputs a pixel signal including an electric signal corresponding to the electric charge. The solid-state image pickup element 31 and the glass substrate 32 having the IRCF function are bonded together through a transparent adhesive 61. The lowermost lens 92 is bonded to the glass substrate 32 having the IRCF function, through an adhesive 62. That is, from above in the figure, the lens 92, the adhesive 62, the glass substrate 32 having the IRCF function, the adhesive 61, and the solid-state image pickup element 31 are layered in this order.

Because of the configuration as illustrated in FIG. 1, the CSP solid-state image pickup element 22 is dealt with as one component in an assembly process.

The lens 91 forms one group in a case where the two groups of the lenses 91 and 92 forming the lens 9 (FIG. 7) are regarded as one optical system. The lens 91 includes at least one lens that condenses light from a subject onto the image-pickup face of the solid-state image pickup element 31.

The actuator 38 drives the lens 91, with respect to the direction of facing to the solid-state image pickup element 31, upward and downward or horizontally in the figure, resulting in achievement of at least one of an autofocus function or a hand shake correction function.

The circuit board 37 outputs the electric signal of the CSP solid-state image pickup element 22, outward. The spacer 40 fixes the CSP solid-state image pickup element 22, in connection with the circuit board 37 and a fixative 43 including, for example, a black resin that absorbs light of the CSP solid-state image pickup element 22. Furthermore, the actuator 38 is mounted on the upper-face portion of the spacer 40 in the figure, so that the spacer 40 fixes the lens 91 and the actuator 38.

Semiconductor components 42, such a capacitor and a large-scale integration (LSI) of actuator control, necessary for the solid-state image pickup element 31 of the CSP solid-state image pickup element 22 and the driving of the actuator 38 are implemented on the circuit board 37 and the spacer 40.

Moreover, the CSP solid-state image pickup element 22 has four corners to be fitted into fixation portions 41-1 to 41-4 provided at the spacer 40. Fitting of the corners enables the CSP solid-state image pickup element 22 to be guided by only the effect of gravity into a substantially appropriate position on the circuit board 37 for fixation even before injection of the fixative 43 to the circuit board 37. In other words, the fixation portions 41-1 to 41-4 are formed at the spacer 40 such that the four corners of the CSP solid-state image pickup element 22 are guided into the appropriate position on the circuit board 37 by fitting the CSP solid-state image pickup element 22 into the opening of the spacer 40.

A connector 39 outputs an image signal output from the solid-state image pickup element 31, outward through the circuit board 37.

As illustrated in FIG. 1, the image pickup element 21 including the lens 92 and the CSP solid-state image pickup element 22 functions as part of the image pickup device 11.

Here, in the manufacturing process of the image pickup device 11 of FIG. 1, the image pickup element 21 including the lens 92 and the CSP solid-state image pickup element 22 is implemented on the circuit board 37. Then, for a countermeasure against flare and ghost and a countermeasure against inclination, the fixative 43 that fixes the periphery of the CSP solid-state image pickup element 22 is applied, and then the actuator 38 and the upper lens 91 are implemented.

However, in a case where a defect in shape or a warp occurs in at least either the lens 92 or the CSP solid-state image pickup element 22 in the image pickup element 21, the assembled image pickup device 11 has difficulty in carrying out appropriate image capturing. Thus, the actuator 38 and the upper lens 91 used in the assembled image pickup device 11 are useless, resulting in deterioration in yield and increase in manufacturing cost.

Therefore, in the present disclosure, before assembly of the image pickup device 11 as above, the performance of the image pickup element 21 is inspected so as to enable assembly of the image pickup device 11 with a selected proper image pickup element 21, for improvement in yield and reduction in manufacturing cost.

2. First Embodiment

Figure 2:
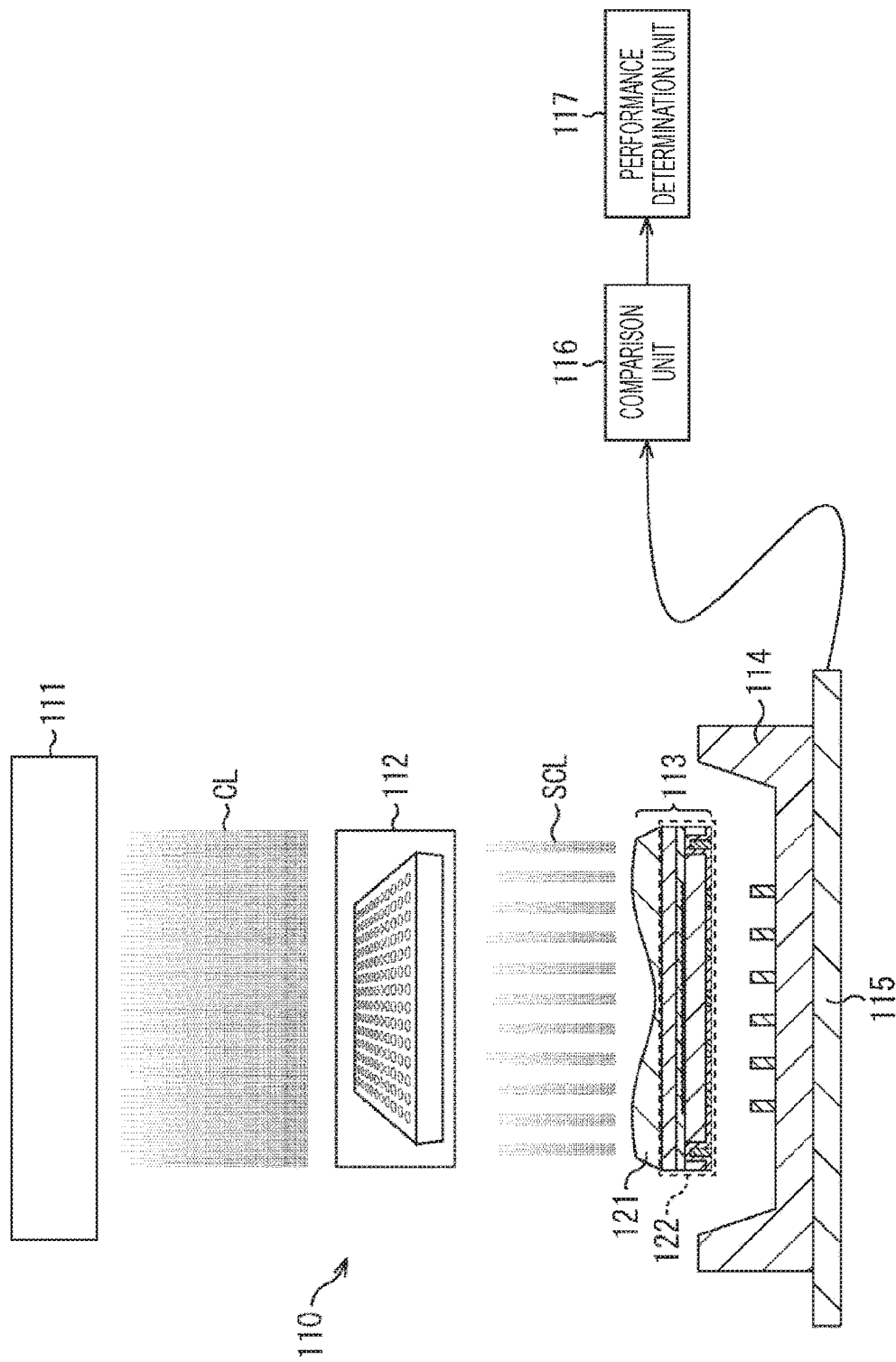
FIG. 2 explanatorily illustrates an exemplary configuration of a first embodiment of the inspection apparatus according to the present disclosure.

FIG. 2 explanatorily illustrates an exemplary configuration of a first embodiment of an inspection apparatus that inspects the shape of a lens on an image pickup element, applied with a technology of the present disclosure.

An inspection apparatus 110 of FIG. 2 includes a collimated-light emission unit 111, a transmission filter 112, an image pickup element 113, a connection 114, a substrate 115, a comparison unit 116, and a performance determination unit 117.

The collimated-light emission unit 111 uniformly emits collimated light (parallel light) to the transmission filter 112 in the figure.

Figure 3:
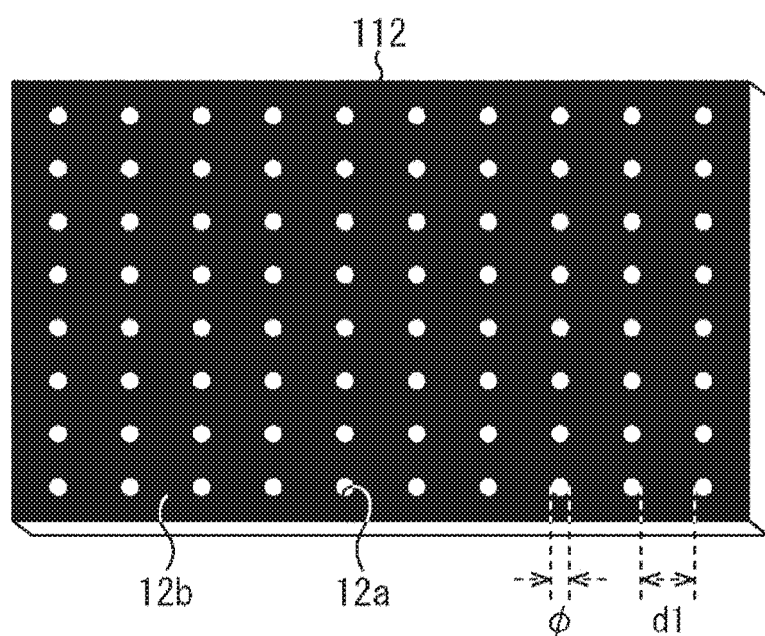
FIG. 3 explanatorily illustrates an exemplary configuration of a transmission filter.

For example, as illustrated on the left of FIG. 3, the transmission filter 112 has a flat light-blocking face 112b perpendicular to the collimated light. Circular holes 112a having a diameter of φ are formed regularly at predetermined intervals of d1, laterally and longitudinally at the light-blocking face 112b.

With such a configuration, the flat light-blocking face 112b of the transmission filter 112 is perpendicularly irradiated with the collimated light CL uniformly emitted by the collimated-light emission unit 111. The light-blocking face 112b blocks part of the collimated light CL, and the other part of the collimated light CL is transmitted through the circular holes 112a arranged regularly, resulting in conversion to rays of columnar collimated light SCL arranged regularly.

Below the transmission filter 112, the image pickup element 113 connected with the connection 114 is arranged with the light-receiving face of the image pickup element 113 facing parallel to the transmission filter 112. Note that, although FIG. 2 illustrates the image pickup element 113 out of connection with the connection 114, the image pickup element 113 is physically and electrically in connection with the connection 114.

The image pickup element 113 includes a lens 121 and a CSP solid-state image pickup element 122 layered from above in the figure. The image pickup element 113 photoelectrically converts light condensed by the lens 121, to generate a pixel signal corresponding to the quantity of incident light having entered the image pickup face of the CSP solid-state image pickup element 122, and outputs the pixel signal to the comparison unit 116 through the connection 114 and the substrate 115.

Note that the image pickup element 113 of FIG. 2 corresponds to the image pickup element 21 of FIG. 1, the lens 121 of FIG. 2 corresponds to the lowermost lens 92 of FIG. 1, and the CSP solid-state image pickup element 122 of FIG. 2 corresponds to the CSP solid-state image pickup element 22 of FIG. 1.

The connection 114 electrically connected with the substrate 115, supplies power to the image pickup element 113 and additionally outputs data of an image including pixel signals in units of pixels output from the image pickup element 113, to the comparison unit 116 through the substrate 115.

The comparison unit 116 stores data of an image including ideal pixel signals generated, at the time of supply of the rays of collimated light SCL, by the image pickup element 13 in which the lens 121 and the CSP solid-state image pickup element 122 have no distortion. The comparison unit 116 compares the data of the image including ideal pixel signals, with data of an image including pixel signals detected with the rays of collimated light SCL, supplied by the image pickup element 113, and then outputs a comparison result to the performance determination unit 117.

More specifically, between the stored data of the image including ideal pixel signals and the data of the image including pixel signals practically detected, supplied by the image pickup element 113, the comparison unit 116 acquires the sum of difference absolute values in pixel value between adjacent pixels, as the comparison result, for output to the performance determination unit 17.

The performance determination unit 17 determines whether or not the lens 121 of the image pickup element 113 connected with the connection 114 has proper performance, on the basis of the comparison result between the data of the image including ideal pixel signals and the data of the image including pixel signals practical, supplied by the image pickup element 13, namely, the sum of inter-pixel difference absolute values indicating whether or not the performance in shape of the lens 121 of the image pickup element 113 is close to the ideal value.

<Principle of Performance Determination>

Next, a principle with which the inspection apparatus 110 of FIG. 2 described above determines the performance of the lens 121, will be described with reference to FIG. 4.

Figure 4:
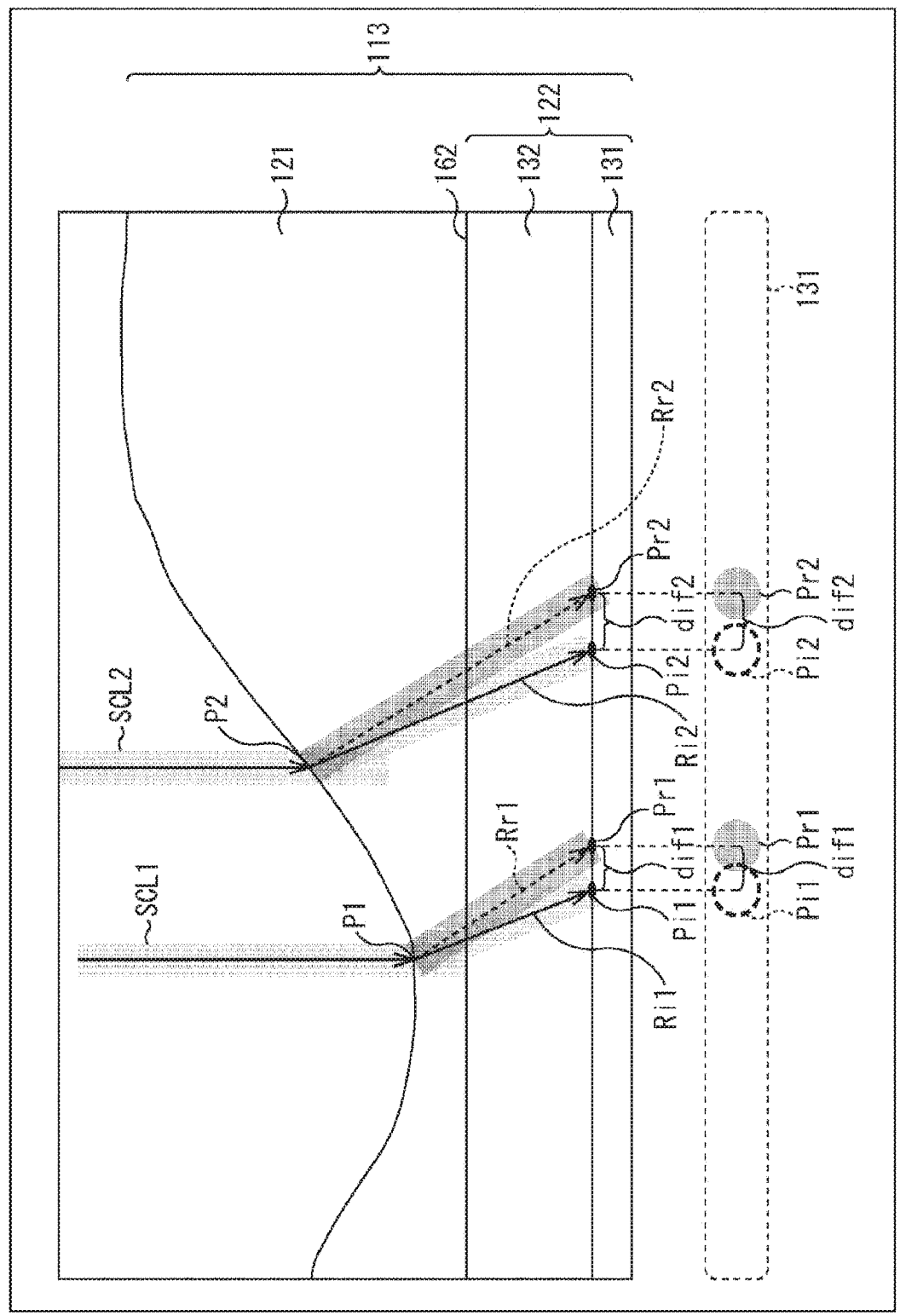
FIG. 4 explanatorily illustrates the principle of inspection in the inspection apparatus of FIG. 2.

For example, as illustrated in FIG. 4, when rays of cylindrical collimated light SCL1 and SCL2 arrayed regularly enter the CSP solid-state image pickup element 122 on which the lowermost lens 121 is formed, the optical paths of the rays of cylindrical collimated light SCL1 and SCL2 in the lens 121 to the CSP solid-state image pickup element 122 are different mutually. Note that a side sectional view of the lens 121 and the CSP solid-state image pickup element 122 is given on the upper side of FIG. 4, and the incident positions of incident light on the image pickup face of a solid-state image pickup element 131 are illustrated on the lower side of FIG. 4. Furthermore, the lens 121 and the CSP solid-state image pickup element 122 are bonded together through a transparent adhesive 162 negligible in refractive index.

That is, as illustrated in FIG. 4, when entering the lowermost lens 121, the rays of cylindrical collimated light SCL1 and SCL2 are refracted in accordance with the surface shape of the lowermost lens 121 under Snell's law.

How to capture an image to be captured ideally with rays of collimated light arrayed regularly ideally, incident on the lowermost lens 121 having an ideal shape and being centered on the CSP solid-state image pickup element 122 and the CSP solid-state image pickup element 122 ideally having no warp and no distortion, can be calculated with the surface shapes and the refractive indices of the lowermost lens 121 and a glass substrate 132.

That is, as illustrated in FIG. 4, in a case where the rays of collimated light SCL1 and SCL2 arrayed regularly ideally enter positions P1 and P2 on the lens 121, respectively, the rays of collimated light SCL1 and SCL2 are refracted as indicated with optical paths Ri1 and Ri2 in accordance with the surface shape under Snell's law, and then enter positions Pi1 and Pi2 that are ideal positions on the solid-state image pickup element 31.

However, in practical manufacturing, the actual incident positions deviate from the ideal positions due to, for example, the tilt, an error in surface shape, or the thickness of the lens 121, the distortion or warp of the solid-state image pickup element 131, or the deviation of the lowermost lens 121 from the center. Note that the solid-state image pickup element 131 of FIG. 4 corresponds to the solid-state image pickup element 31 of FIG. 1.

That is, for the case of FIG. 4, in a case where the rays of collimated light SCL1 and SCL2 arrayed regularly ideally enter the positions P1 and P2 on the lens 121, respectively, the rays of collimated light SCL1 and SCL2 are refracted as indicated with optical paths Rr1 and Rr2 due to tilt, an error in surface shape, thickness, the distortion or warp of the solid-state image pickup element 131, or the deviation of the lowermost lens 121 from the center, and then enter positions Pr1 and Pr2 deviating from the ideal positions as the actual incident positions on the solid-state image pickup element 131.

Therefore, the deviation between the ideal position Pi1 and the actual incident position Pr1 and the deviation between the ideal position Pi2 and the actual incident positions Rr2 on the solid-state image pickup element 131, result in amounts of deviation dif1 and dif2, respectively. In a case where the amounts of deviation dif1 and dif2 each exceed a predetermined allowable amount, a large distortion occurs in an image that the solid-state image pickup element 31 captures, resulting in a useless defective product.

In the inspection apparatus 110 of FIG. 2, after the CSP solid-state image pickup element 122 receives the rays of cylindrical collimated light arranged regularly illustrated in FIG. 4 for image capturing, for example, the sum of inter-pixel difference absolute values between data of the captured actual image and data of the ideal image is calculated and then is compared with a predetermine threshold for performance inspection.

That is, in a case where the tilt, an error in surface shape, or the thickness of the lens 121, the distortion or warp of the solid-state image pickup element 131, or the deviation of the lowermost lens 121 from the center is sufficiently small for practical use, the sum of inter-pixel difference absolute values between the data of the actual image and the data of the ideal image is smaller than the predetermined value. Therefore, the performance determination unit 117 can determine that the image pickup element 113 being inspected is a non-defective product, in a case where the sum of inter-pixel difference absolute values is smaller than the predetermined value. The performance determination unit 117 can determine that the image pickup element 113 being inspected is a defective product, in a case where the sum of inter-pixel difference absolute values is larger than the predetermined value. As a result, inspection of the image pickup element 113 based on whether or not the image pickup element 113 being inspected is a defective product, is achieved.

Note that the reason why the image captured by the CSP solid-state image pickup element 122 with the rays of cylindrical collimated light arranged regularly is used for the comparison is because, for example, use of entirely uniform collimated light is likely to cause light from other optical paths to enter the ideal positions, resulting in difficulty in verifying the presence or absence of deviation in optical path.

Thus, the diameter of φ of each circular hole 112a of the transmission filter 112 of FIG. 2 theoretically needs at least to be not less than the size of a pixel, and the interval of d1 between each circular hole 112a of the transmission filter 112 theoretically needs at least to be not less than the size of a pixel. Moreover, the density in arrangement of the circular holes 112a of the transmission filter 112 may be varied as long as the size of each circular hole 112a and the interval between each circular hole 112a described above are retained. Note that, preferably, the density in arrangement of the circular holes 112a is provided such that the circular holes 112a are formed sufficiently widely and uniformly to the effective pixel region of the CSP solid-state image pickup element 122, for verification of the state of the entire face of the lens 121.

<Inspection Processing>

Figure 5:
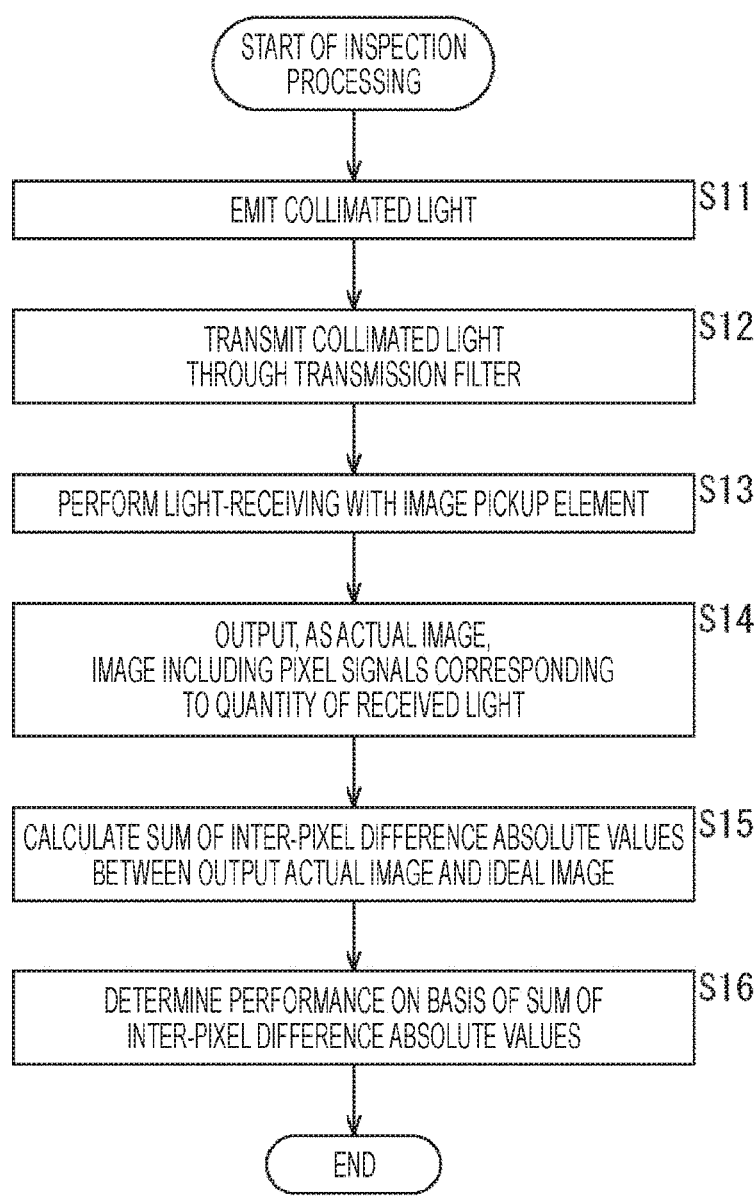
FIG. 5 is an explanatory flowchart of inspection processing of the inspection apparatus according to the present disclosure.

Next, inspection processing of the inspection apparatus 110 of FIG. 2 will be described with reference to a flowchart of FIG. 5.

At step S11, the collimated-light emission unit 111 emits collimated light perpendicularly to the transmission filter 112.

At step S12, part of the collimated light projected by the collimated-light emission unit 111 is transmitted through the circular holes 112a arranged regularly at the transmission filter 112, and the other part of the collimated light is blocked by the light-blocking face 112b. As a result, rays of columnar collimated light arranged regularly are formed perpendicularly to the transmission filter 112.

At step S13, the rays of cylindrical collimated light arranged regularly are transmitted through the lens 121, and then are received on the image-pickup face of the CSP solid-state image pickup element 122.

At step S14, the CSP solid-state image pickup element 122 receives the rays of columnar collimated light arranged regularly, captures an image including pixel signals corresponding to the quantity of light, and outputs the image to the comparison unit 116.

At step S15, the comparison unit 116 acquires the sum of differences in pixel value between mutually corresponding pixels between the data of the actual image that is the image captured by the CSP solid-state image pickup element 122 and the data of the ideal image captured with the lens 121 having an ideal shape (sum of inter-pixel difference absolute values) as the value indicating the level of the amount of deviation of each pixel between the actual image and the ideal image, for output to the performance determination unit 117.

At step S16, the performance determination unit 117 compares the sum of inter-pixel difference absolute values indicating the level of the amount of deviation of each pixel between the actual image that is the image captured by the CSP solid-state image pickup element 122, with the ideal image captured with the lens 121 having an ideal shape, and determines performance to inspect whether or not to be a defective product.

With relatively simplicity, the performance of the image pickup element 113 equipped with the lens 121 is determined by the processing as above, so that the presence or absence of any defect of the image pickup element 113 can be inspected on the basis of a result of the determination.

This arrangement enables, before assembly of the image pickup device 11, determination of the performance of the image pickup element 113 and inspection of whether or not the image pickup element 113 is a defective product. Thus, the image pickup device 11 can be assembled with a selected proper image pickup element 113 that is a non-defective product different from a defective product.

As a result, any defective image pickup element 113 is prevented from being mounted on the image pickup device 11. Thus, the yield of manufacturing of the image pickup device 11 can be improved, resulting in reduction in manufacturing cost.

Note that, for the predetermined threshold for comparison with the sum of inter-pixel difference absolute values, a plurality of thresholds corresponding to a plurality of grades may be set, and performance may be determined so as to belong to any of the plurality of grades. In this case, any image pickup elements having performance determined as not less than a predetermined grade, may be used for assembly of an image pickup device. Particularly, in a case where a high-accuracy image pickup device is required, an image pickup element belonging to the highest grade may be adopted.

Furthermore, for comparison between the data of the actual image that is the image captured by the CSP solid-state image pickup element 122 and the data of the ideal image captured with the lens 121 having an ideal shape, a value different from the sum of inter-pixel difference absolute values described above may be used. For example, the inter-pixel difference average value, the average value of ratios in pixel value between pixels, or the difference or ratio in pixel value in units of blocks may be compared with the threshold.

3. First Modification of First Embodiment

The exemplary configuration of the transmission filter 112 has been described above, in which the circular holes 112a are formed regularly at the predetermined intervals, laterally and longitudinally at the light-blocking face 112b. However, collimated light needs at least to be transmitted to part of the entire face of the CSP solid-state image pickup element 122 and not to be transmitted to the other part. Thus, holes to be formed at the transmission filter 112 are not necessarily circular as long as to be arranged regularly, unlike the circular holes 112a. Thus, instead of circular holes, for example, quadrangular holes or triangular holes may be formed, or all holes are not necessarily identical in shape. Moreover, the holes and the light-blocking face may be converted in arrangement. For example, the transmission filter 112 of FIG. 3 may be formed as a hole in principle, and circular light-blocking faces 112b may be arranged regularly therein.

Figure 6:
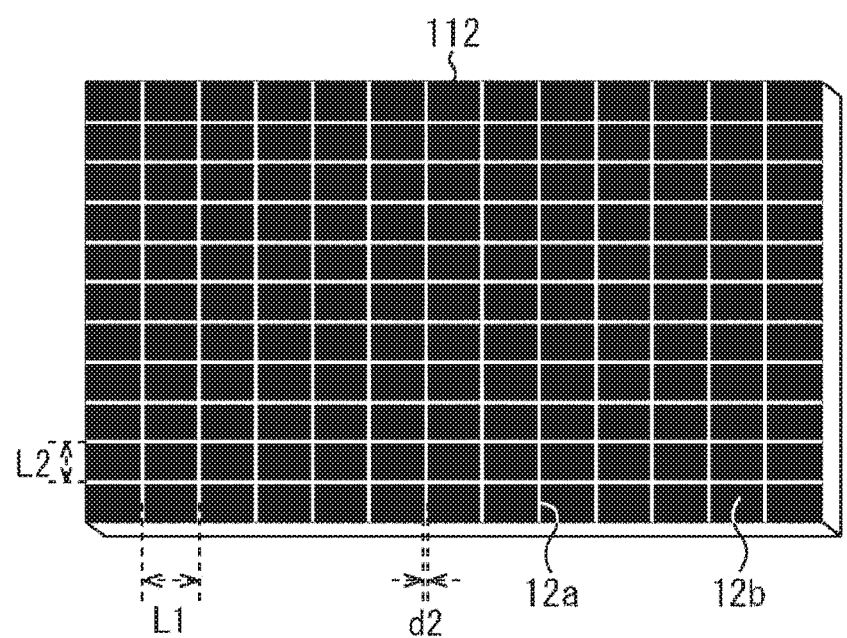
FIG. 6 explanatorily illustrates a first modification of the first embodiment.

Furthermore, as illustrated in FIG. 6, holes having a width of d2 may be formed in a grid pattern (linearly laterally and longitudinally) (areas through which collimated light is transmitted) such that light-blocking faces 112b are each formed in a quadrangle of a lateral size of L1×a longitudinal size of L2. That is, linear holes may be provided.

4. Second Modification of First Embodiment

The example has been given above in which the performance of the lens 121 is determined by acquisition of the sum of inter-pixel difference absolute values between the data of the actual image that is the image including the pixel signals received through the entirety of the image pickup region of the solid-state image pickup element 31 of the CSP solid-state image pickup element 122 and the data of the ideal image.

Figure 7:
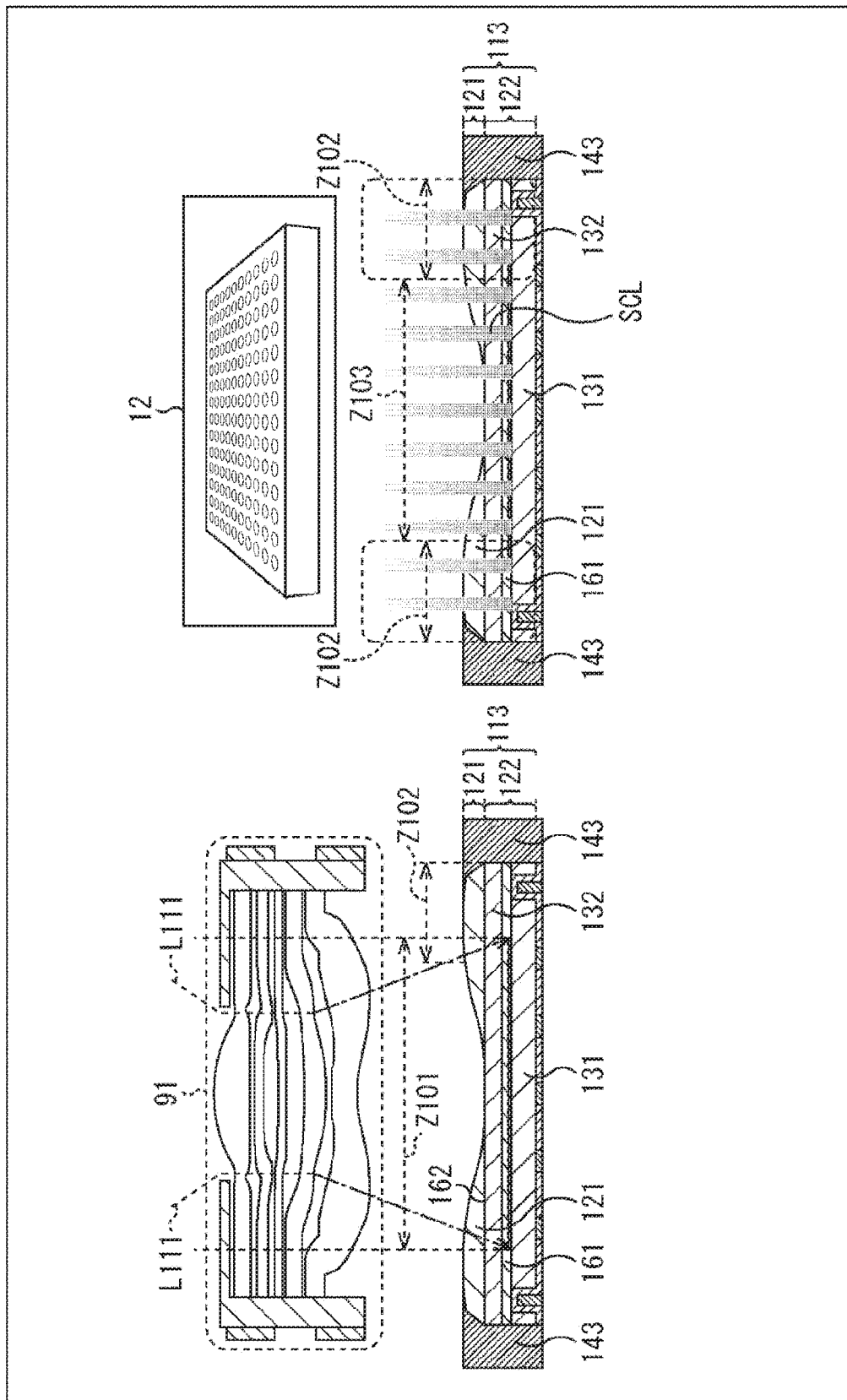
FIG. 7 explanatorily illustrates a second modification of the first embodiment.

However, as illustrated on the left of FIG. 7, in a case where, for flare reduction, a fixative 143 including a light-absorbing material, such as a black resin, is embedded on the periphery of the CSP solid-state image pickup element 122 equipped with the lowermost lens 121, the fixative 143 is embedded (applied) such that the fixative 143 covers a mask area Z102 including a region different from the effective pixel region Z101 of the CSP solid-state image pickup element 122 that incident light enters as indicated with an optical path L111 of light that the lowermost lens 121 condenses.

That is, the light that enters the effective pixel region 2101 from the lowermost lens 121, enters the pixels in the effective pixel region Z101 of the CSP solid-state image pickup element 122, typically at an acute angle from outside, so that a flare phenomenon is likely to occur. Therefore, as illustrated on the left of FIG. 7, typically, the fixative 143 including a light-absorbing material, such as a black resin, is embedded (applied) in the mask area Z102 that is the outer circumferential portion of the lowermost lens 121.

With such a configuration, as illustrated on the right of FIG. 7, the rays of columnar collimated light SCL arranged regularly are received in an effective optical region Z103 excluding the portion overlapping the mask area Z102, from the effective pixel region Z101 in the image pickup face of the CSP solid-state image pickup element 122. In contrast to this, the collimated light SCL in the range surrounded with a dotted line in the figure is not received in the region in the image pickup face of the CSP solid-state image pickup element 122, that is identical in width to the mask area Z102 and is different from the effective optical region Z103, as an insensitive region.

Here, the effective optical region Z103 can be acquired by calculation from the configuration between the upper lens 91 and the lowermost lens 121. That is the region that is identical in width to the mask area Z102 and is the insensitive region in the image pickup face of the CSP solid-state image pickup element 122, in the CSP solid-state image pickup element 122, can be acquired from the effective optical region Z103.

Therefore, the comparison unit 116 may compare the ideal image with, as the actual image, only the image in the effective optical region Z103 from the image captured by the solid-state image pickup element 131 in the CSP solid-state image pickup element 122.

This arrangement enables reduction in the computational complexity of the sum of inter-pixel difference absolute values between the actual image and the ideal image, so that an improvement can be made in processing speed.

5. Third Modification of First Embodiment

As above, the image is output to the comparison unit 116 through the substrate 115, with the image pickup element 113 including the lens 121 mounted on the CSP solid-state image pickup element 122, in connection with the dedicated connection 114. However, with an image pickup element 113 mounted on a circuit board 211, fitting in a spacer 211a on the circuit board 211, in electrical connection with the circuit board 211, an output may be made to a comparison unit 116 through a connector 211b of the circuit board 211 and a connector 115a of a substrate 115.

Figure 8:
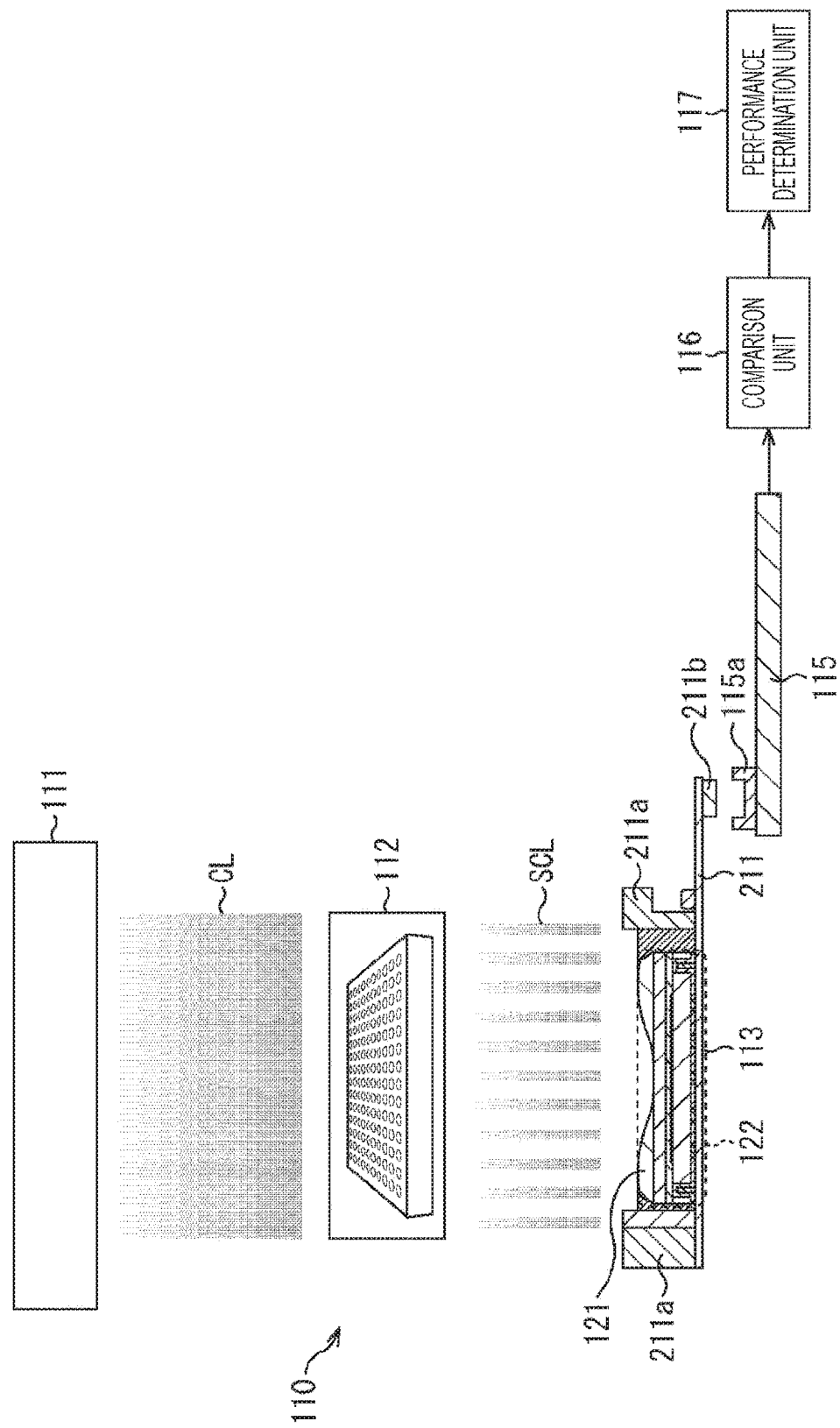
FIG. 8 explanatorily illustrates a third modification of the first embodiment.

FIG. 8 illustrates an exemplary configuration of an inspection apparatus 110 in which, with an image pickup element 113 mounted on the circuit board 211, fitting in the spacer 211a on the circuit board 211, in electrical connection with the circuit board 211, an output is made to the comparison unit 116 through the connector 211b of the circuit board 211 and the connector 115a of the substrate 115. Note that, in FIG. 8, constituents identical in function to those of FIG. 2 are denoted with the same reference signs, and thus the descriptions thereof will be appropriately omitted.

That is, in the inspection apparatus 110 of FIG. 8, the image pickup element 113 fitted in the spacer 211a provided on the circuit board 211 is in electrical connection with the circuit board 211, similarly to the image pickup element 21 mounted on the spacer 40 provided on the circuit board 37 of FIG. 1. Furthermore, the connector 211b of the circuit board 211 is in electric connection with the connector 115a provided on the substrate 115.

The configuration of the image pickup element 113 and the circuit board 211 of FIG. 8, corresponds to the state before the actuator 38 provided with the upper lens 91 is mounted in the process of manufacturing the image pickup device 11 described with reference to FIG. 1.

As above, with the configuration before the actuator 38 provided with the upper lens 91 is mounted in the process of manufacturing the image pickup device 11, the image captured by the CSP solid-state image pickup element 122 in the image pickup element 113 is output to the comparison unit 116 through the circuit board 211, the connectors 211b and 115a, and the substrate 115 in electrical connection.

As a result, without a particular constituent like the connection 114, the performance of the image pickup element 113 can be inspected with a partial configuration in the manufacturing process of the image pickup device 11, similarly to the inspection apparatus 110 of FIG. 2.

6. Fourth Modification of First Embodiment

The example has been given above in which the lowermost lens 121 used in the image pickup element 113 is one lens. As long as the refractive index at the boundary between each lens is negligibly small, a lowermost lens 121 including a plurality of lenses may be provided.

Figure 9:
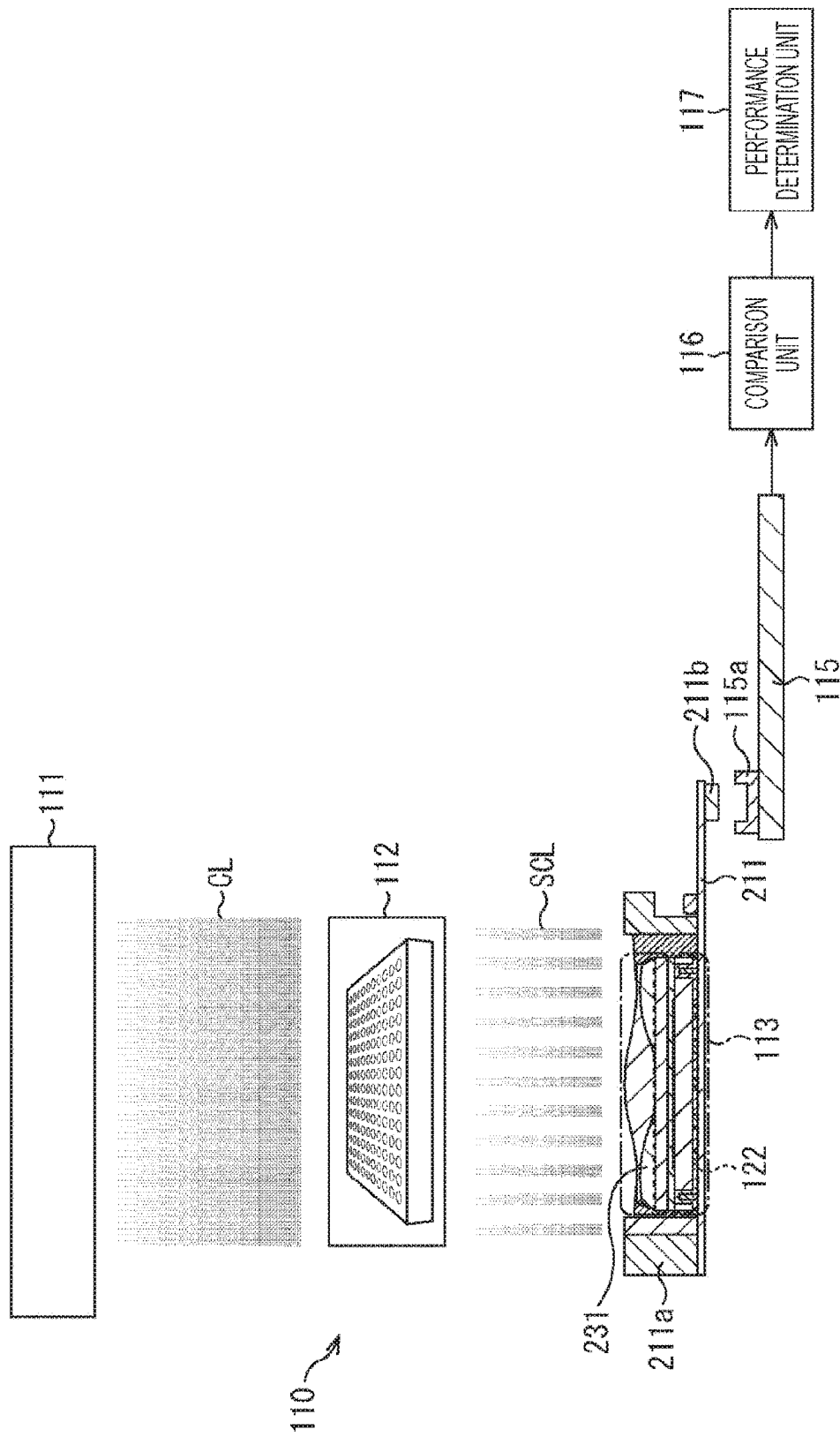
FIG. 9 explanatorily illustrates a fourth modification of the first embodiment.

FIG. 9 illustrates an exemplary configuration of an inspection apparatus 110 in a case where a lowermost lens 121 includes a plurality of lenses in which the refractive index at the boundary between each lens is negligibly small.

Note that, in the inspection apparatus 110 of FIG. 9, constituents identical in function to those in the inspection apparatus 110 of FIG. 8 are denoted with the same reference signs, and thus the descriptions thereof will be appropriately omitted.

That is, in the inspection apparatus 110 of FIG. 9, an image pickup element 231 is provided, instead of the image pickup element 113. The image pickup element 231 is two in the number of lenses in the lowermost lens 121 in comparison to the image pickup element 113. For example, the plurality of lenses in the lens 121 is bonded together through a transparent adhesive. Thus, the refractive index at the boundary between each lens can be made negligibly small.

Note that, in FIG. 9, the example has been given in which the lens 121 includes two lenses. As long as the refractive index at the boundary between each lens is negligibly small, a lens 121 including three lenses or more may be provided.

The configuration as above enables inspection of the performance of the image pickup element 231 including the lowermost lens 121 including the plurality of lenses, mounted on the CSP solid-state image pickup element 122.

7. Second Embodiment

The example has been given above in which the performance of the image pickup element 113 including the lens 121 mounted on the CSP solid-state image pickup element 122 is inspected. The performance of an image pickup element 113 including only the CSP solid-state image pickup element 122 equipped with no lens 121 may be inspected.

Figure 10:
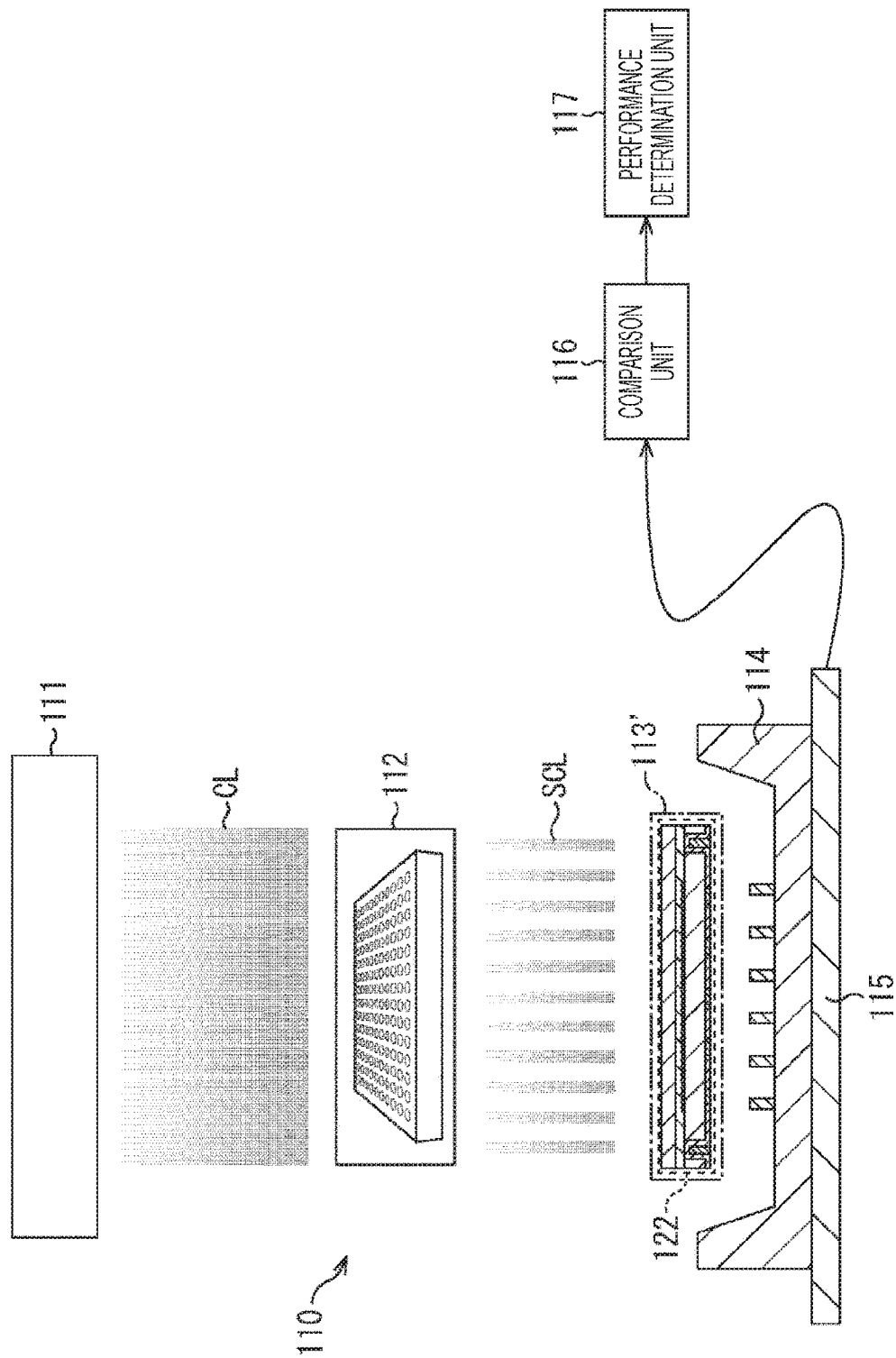
FIG. 10 explanatorily illustrates an exemplary configuration of a second embodiment of the inspection apparatus according to the present disclosure.

FIG. 10 illustrates an exemplary configuration of an inspection apparatus 110 that inspects the performance of an image pickup element 113' including only a CSP solid-state image pickup element 122 equipped with no lens 121.

The inspection apparatus 110 of FIG. 10 is different from the inspection apparatus 110 of FIG. 2 in that, instead of the image pickup element 113 including the lens 121 mounted on the CSP solid-state image pickup element 122, provided is the image pickup element 113' including only the CSP solid-state image pickup element 122 equipped with no lens 121 in comparison to the image pickup element 113.

That is, the inspection apparatus 110 of FIG. 10 is identical in apparatus configuration to the inspection apparatus 110 of FIG. 2.

<Principle of Inspection of Image Pickup Element Including Only CSP Solid-State Image Pickup Element>

Figure 11:
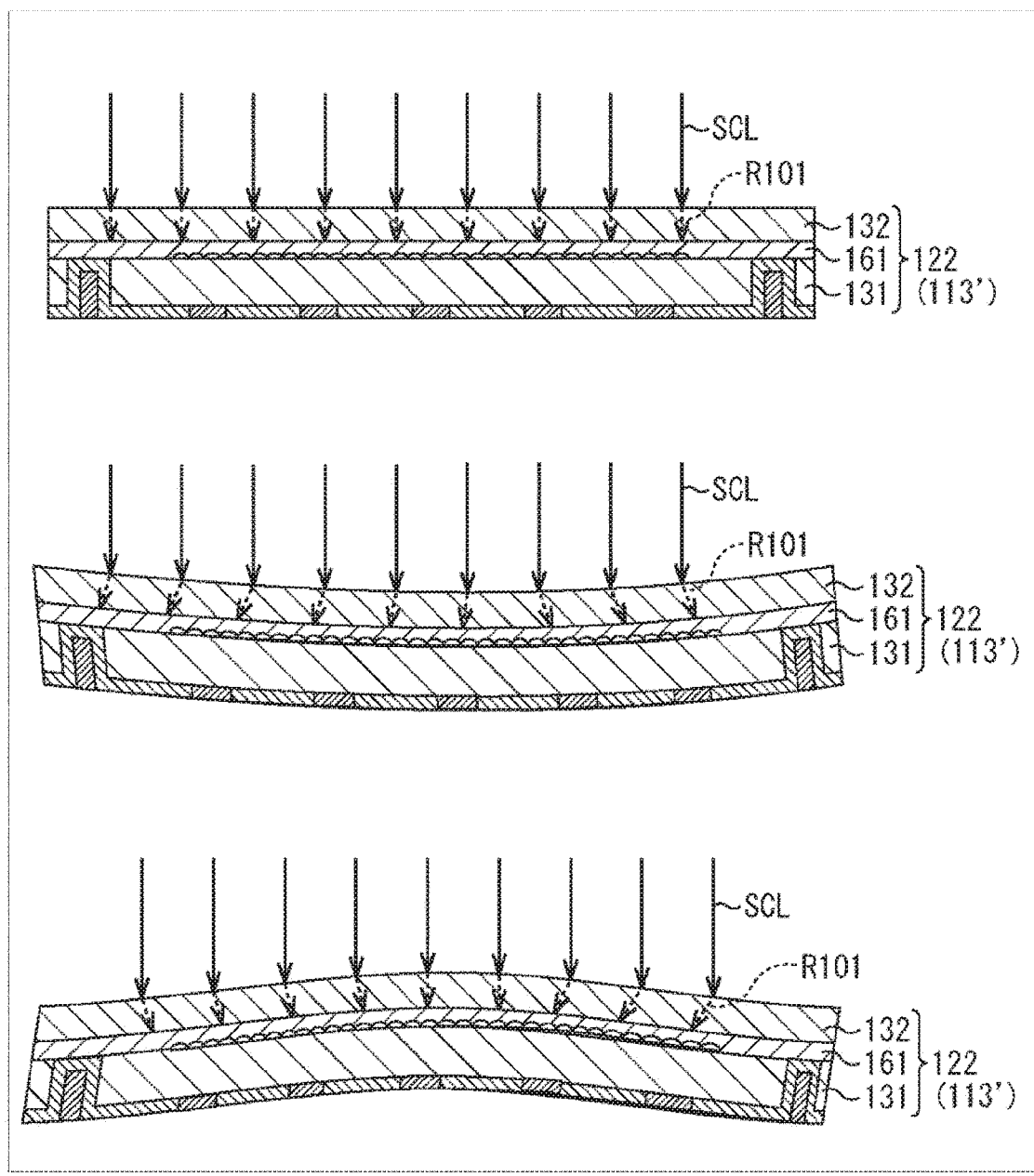
FIG. 11 explanatorily illustrates the principle of inspection in the inspection apparatus of FIG. 10.

For example, as illustrated on the upper side of FIG. 11, in a case where no warp or distortion occurs in the image pickup element 113' including only the CSP solid-state image pickup element 122, to be inspected by the inspection apparatus 110 of FIG. 10 and in a case where rays of columnar collimated light SCL arranged regularly indicated with solid arrows enter the image pickup element 113' from above in the figure, the rays of collimated light SCL enter a solid-state image pickup element 131 (transparent adhesive 161 on the surface thereof) straight with no refraction, as indicated with dotted arrows R101, in a glass substrate 132 provided in the front of the CSP solid-state image pickup element 122 (corresponding to the glass substrate 32 of FIG. 1).

Therefore, as illustrated on the upper side of FIG. 11, if the image pickup element 113' has no warp or distortion, for example, no distortion occurs in an image that the CSP solid-state image pickup element 122 captures.

In contrast to this, as illustrated on the middle side of FIG. 11, in a case where a warp or distortion occurs such that the central portion of the image pickup element 113' protrudes upward in the figure and in a case where rays of collimated light SCL indicated with solid arrows enter the image pickup element 113' from above in the figure, the rays of collimated light SCL enter the solid-state image pickup element 131 more outward obliquely as apart from the center of the solid-state image pickup element 131 (transparent adhesive 161 on the surface thereof) to outside, with refraction, as indicated with dotted arrows R101, in the glass substrate 132 provided in the front of the CSP solid-state image pickup element 122 (corresponding to the glass substrate 32 of FIG. 1).

That is, as illustrated on the middle side of FIG. 11, in a case where the center of the image pickup element 113' warps upward in the figure, for example, a distortion is likely to occur in an image that the CSP solid-state image pickup element 122 captures.

Furthermore, as illustrated on the lower side of FIG. 11, in a case where a warp or distortion occurs such that the central portion of the image pickup element 113' protrudes downward in the figure and in a case where rays of collimated light SCL indicated with solid arrows enter the image pickup element 113' from above in the figure, the rays of collimated light SCL enter the solid-state image pickup element 131 more inward obliquely as apart from the center of the solid-state image pickup element 131 (transparent adhesive 161 on the surface thereof) to outside, with refraction, as indicated with dotted arrows R101, in the glass substrate 132 provided in the front of the CSP solid-state image pickup element 122 (corresponding to the glass substrate 32 of FIG. 1).

That is, as illustrated on the lower side of FIG. 11, in a case where the center of the image pickup element 113' warps downward in the figure, for example, a distortion is likely to occur in an image that the CSP solid-state image pickup element 122 captures.

That is, with no distortion or warp as illustrated on the upper side of FIG. 11, the image captured by the solid-state image pickup element 131 of the CSP solid-state image pickup element 122 is defined as the ideal image, and the image captured in practice by the solid-state image pickup element 131 of the CSP solid-state image pickup element 122 is defined as the actual image. The inter-pixel difference absolute values between data of the ideal image and data of the actual image is acquired and then is compared with a threshold, so that the performance can be inspected.

As a result, similarly to the inspection apparatus 110 in FIG. 2, instead of the image pickup element 113 including the lens 121 and the CSP solid-state image pickup element 122, mounting only the image pickup element 113' including only the CSP solid-state image pickup element 122 equipped with no lens 121, onto the inspection apparatus 110 illustrated in FIG. 10, enables inspection of the performance of the image pickup element 113' including only the CSP solid-state image pickup element 122 (only CSP solid-state image pickup element 122).

Note that inspection processing of the inspection apparatus 110 of FIG. 10 is similar to that of the inspection apparatus 110 of FIG. 2, and thus the description thereof will be omitted.

8. Modification of Second Embodiment

As above, the image is output to a comparison unit 116 through a substrate 115, with the image pickup element 113' including only the CSP solid-state image pickup element 122, in connection with a dedicated connection 114. However, with an image pickup element 113' mounted on a circuit board 211, fitting in a spacer 211a on the circuit board 211, in electrical connection with the circuit board 211, an output may be made to a comparison unit 116 through a connector 211b of the circuit board 211 and a connector 115a of the substrate 115.

Figure 12:
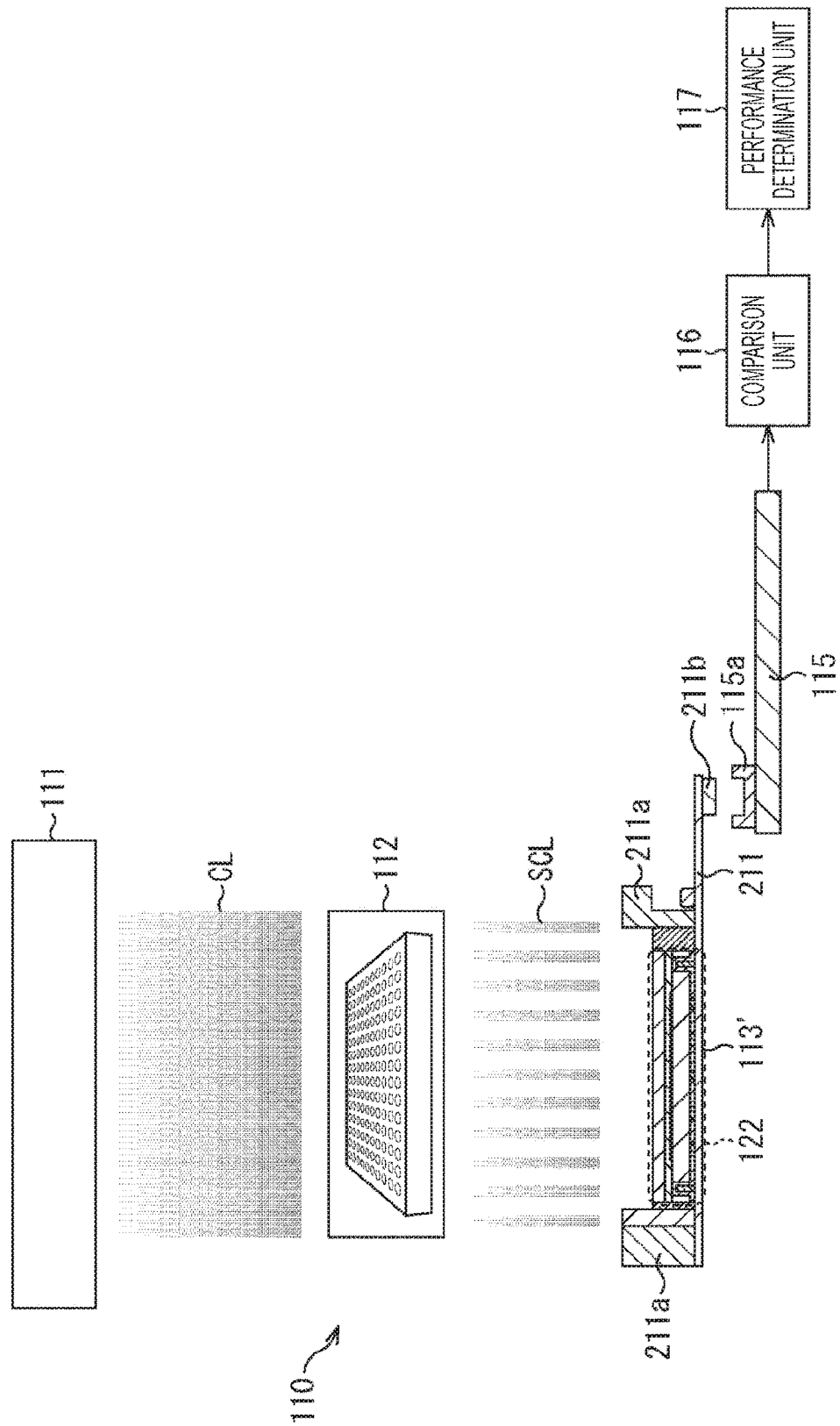
FIG. 12 explanatorily illustrates a modification of the second embodiment.

FIG. 12 illustrates an exemplary configuration of an inspection apparatus 110 in which, with an image pickup element 113' including only the CSP solid-state image pickup element 122, mounted on the circuit board 211, fitting in the spacer 211a on the circuit board 211, in electrical connection with the circuit board 211, an output is made to the comparison unit 116 through the connector 211b of the circuit board 211 and the connector 115a of the substrate 115.

Note that the inspection apparatus 110 of FIG. 12 is similar to the inspection apparatus 110 of FIG. 8 except that the image pickup element 113' including only the CSP solid-state image pickup element 122, is to be inspected, instead of the image pickup element 113 including the lens 121 mounted on the CSP solid-state image pickup element 122, and thus the description thereof will be omitted.

9. Configuration of CSP Solid-State Image Pickup Element

Figure 13:
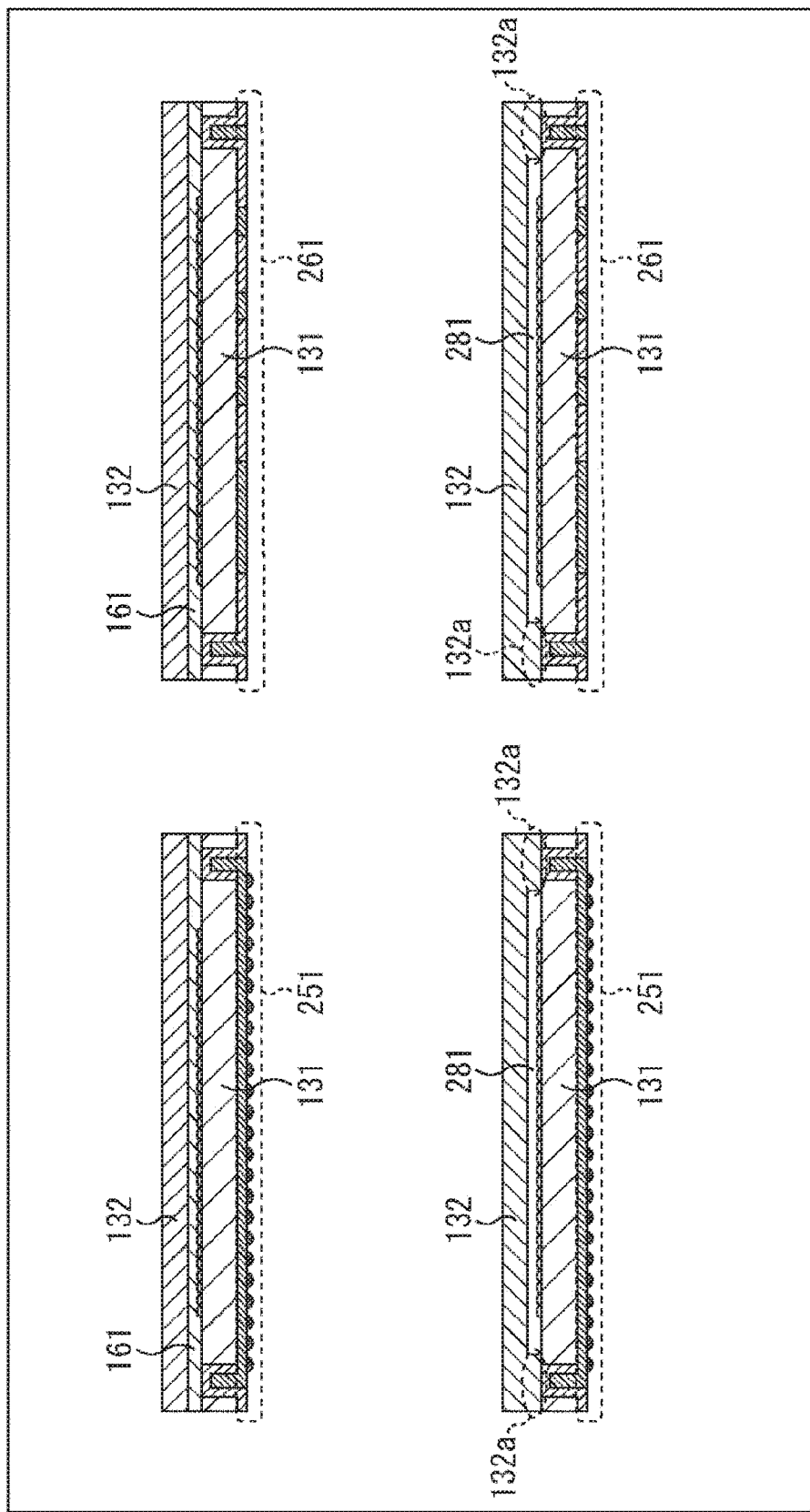
FIG. 13 explanatorily illustrates exemplary configurations of a CSP solid-state image pickup element according to the present disclosure.

For a part to be connected with the connection 114 or the circuit board 211 in the configuration of the CSP solid-state image pickup element 122, either a ball grid array (BGA) terminal 251 illustrated on the upper left of FIG. 13 or a land grid array (LGA) terminal 261 illustrated on the upper right of FIG. 13 may be provided.

Furthermore, for the glass substrate 132 in the configuration of the CSP solid-state image pickup element 122, as illustrated on the lower left and lower right of FIG. 13, a frame 132a may be provided peripherally such that a cavity 281 is provided between the solid-state image pickup element 131 and the glass substrate 132.

Even with either of the configurations for the part to be connected, as described above, both of the image pickup element 113 including the lens 121 mounted on the CSP solid-state image pickup element 122 and the image pickup element 113' including only the CSP solid-state image pickup element 122, can be inspected in performance.

10. Exemplary Carrying-Out by Software

Here, the pieces of processing in series described above can be carried out by hardware or by software. In a case where the pieces of processing in series are carried out by software, a program included in the software is installed from a recording medium onto, for example, a computer built in dedicated hardware or a general-purpose personal computer capable of carrying out various types of functions due to installation of various types of programs.

FIG. 14 illustrates an exemplary configuration of a general-purpose personal computer. The personal computer includes a central processing unit (CPU) 1001. The CPU 1001 is connected with an input/output interface 1005 through a bus 1004. The bus 1004 is connected with a read only memory (ROM) 1002 and a random access memory (RAM) 1003.

The input/output interface 1005 is connected with an input unit 1006 including an input device, such as a keyboard or a mouse, with which a user inputs an operation command, an output unit 1007 that outputs a processing operation screen or an image of a processing result to a display device, a storage unit 1008 including, for example, a hard disk drive that stores a program or various types of data, and a communication unit 1009 that includes, for example, a local area network (LAN) adaptor and carries out communication processing through a network, such as the Internet. Furthermore, the input/output interface 1005 is connected with a drive 1010 that reads data from or writes data into a removable medium 1011, such as a magnetic disk (e.g., a flexible disk), an optical disc (e.g., a compact disc-read only memory (CD-ROM) or a digital versatile disc (DVD), a magneto-optical disc (e.g., a mini disc (MD)), or a semiconductor memory.

The CPU 1001 carries out various types of processing in accordance with the program stored in the ROM 1002 or the program loaded from the storage unit 1008 to the RAM 1003 after installation onto the storage unit 1008 after reading from the removable medium 1011, such as a magnetic disk, an optical disc, a magneto-optical disc, or a semiconductor memory. Furthermore, the RAM 1003 appropriately stores data necessary for the CPU 1001 to carry out the various types of processing.

In the computer as above, for example, the CPU 1001 loads the program stored in the storage unit 1008, to the RAM 1003 through the input/output interface 1005 and the bus 1004, and then executes the program, so that the pieces of processing in series described above are carried out.

The program to be executed by the computer (CPU 1001) can be recorded in, for example, the removable medium 1011 serving as a packaged medium, for provision. Furthermore, the program can be provided through a wired transfer medium or a wireless transfer medium, such as a local area network, the Internet, or digital satellite broadcasting.

In the computer, the program can be installed onto the storage unit 1008 through the input/output interface 1005 after the removable medium 1011 is put into the drive 1010. Furthermore, the program can be installed onto the storage unit 1008 after the communication unit 1009 receives the program through the wired transfer medium or the wireless transfer medium. In addition, the program can be installed in advance onto the ROM 1002 or the storage unit 1008.

Note that the program to be executed by the computer may be a program for carrying out processing on a time series basis in the order described in the present specification, or may be a program for carrying out processing in parallel or with necessary timing at which a call is made.

Note that the comparison unit 116 and the performance determination unit 117 correspond to the CPU 1001 of the personal computer of FIG. 14.

Furthermore, the system in the present specification means an aggregate of a plurality of constituent elements (e.g., devices and modules (components)), regardless of whether or not all the constituent elements are located in the same housing. Therefore, a plurality of devices connected through a network, the devices each being housed in a different housing, and one device including a plurality of modules housed in one housing, are involved all in the system.

Note that embodiments of the present disclosure are not limited to the embodiments described above, and thus various alterations can be made without departing from the scope of the spirit of the present disclosure.

For example, the present disclosure can have a configuration of cloud computing in which a plurality of devices dividedly processes one function in cooperation through a network.

Furthermore, each step in the flowchart described above can be carried out by one device or dividedly carried out by a plurality of devices.

Moreover, in a case where one step includes a plurality of pieces of processing, the plurality of pieces of processing included in the one step can be carried out by one device or dividedly carried out by a plurality of devices.

Note that the present disclosure can have the following configurations.

<1> An inspection apparatus including:
a collimated-light generation unit configured to generate collimated light;
a transmission filter configured to transmit part of the collimated light and block another part of the collimated light different from the part of the collimated light;
an image pickup element configured to capture an image including the part of the collimated light transmitted by the transmission filter; and
an inspection unit configured to compare the image captured by the image pickup element with an ideal image captured by an ideal image pickup element, to inspect the image pickup element.

<2> The inspection apparatus according to <1>, in which
the transmission filter has a flat face including a light-blocking face and has holes for allowing the collimated light to be transmitted, the holes being arranged regularly on the light-blocking face.

<3> The inspection apparatus according to <2>, in which
a plurality of the holes on the flat face including the light-blocking face of the transmission filter are circular, quadrangular, or triangular in shape.

<4> The inspection apparatus according to <2>, in which
the holes on the flat face including the light-blocking face of the transmission filter are linear in shape or are in a grid pattern.

<5> The inspection apparatus according to any of <1> to <4>, in which
the image pickup element includes
a chip size package (CSP) solid-state image pickup element configured to capture an image including a pixel signal corresponding to a quantity of incident light, and
a lens configured to condense the incident light to the CSP solid-state image pickup element.

<6> The inspection apparatus according to <5>, in which
the lens is a lower lens that is part of a lens group of a plurality of lenses that condenses received light, is located on a front side of the image pickup element, is arranged closer to the image pickup element than an upper lens is, the upper lens being part of the lens group, and is another part of the lens group different from the part of the lens group.

<7> The inspection apparatus according to <6>, in which
the lower lens includes a plurality of lenses.

<8> The inspection apparatus according to <5>, further including:
a light-absorbing material that has a function of absorbing light, and is provided to cover a side face of the image pickup element and an outer circumferential portion of the lens, in which
the inspection unit compares the image captured by the image pickup element out of an insensitive region on the image pickup element, due to condensation by the lens having the outer circumferential portion partially covered with the light-absorbing material, with the ideal image captured by the ideal image pickup element, to inspect the image pickup element.

<9> The inspection apparatus according to any of <1> to <4>, in which
the image pickup element includes a chip size package (CSP) solid-state image pickup element that captures an image including a pixel signal corresponding to a quantity of incident light.

<10> The inspection apparatus according any of <1> to <9>, further including:
a calculation unit configured to calculate a difference between the image captured by the image pickup element and the ideal image captured by the ideal image pickup element, in which
the inspection unit compares the difference calculated by the calculation unit with a predetermined threshold, to inspect the image pickup element.

<11> The inspection apparatus according to <10>, in which
the calculation unit calculates a sum of difference absolute values in pixel value between pixels of the image captured by the image pickup element and the ideal image captured by the ideal image pickup element.

<12> The inspection apparatus according to any of <1> to <11>, further including:
a connection that is connected with the image pickup element, and outputs the image including a pixel signal captured by the image pickup element, to the inspection unit.

<13> The inspection apparatus according to any of <1> to <11>, in which
the image pickup element is connected with a circuit board of an image pickup device, and
the image including a pixel signal captured by the image pickup element is output to the inspection unit through the circuit board.

<14> An inspection method including:
collimated-light generation processing of generating collimated light;
transmission processing of transmitting part of the collimated light and blocking another part of the collimated light different from the part of the collimated light; and
inspection processing of comparing an image including the part of the collimated light transmitted by the transmission processing, captured by an image pickup element that captures the image, with an ideal image captured by an ideal image pickup element, to inspect the image pickup element.

<15> A program for causing a computer that controls an inspection apparatus including:
a collimated-light generation unit configured to generate collimated light;
a transmission filter configured to transmit part of the collimated light and block another part of the collimated light different from the part of the collimated light;
an image pickup element configured to capture an image including the part of the collimated light transmitted by the transmission filter; and
an inspection unit configured to compare the image captured by the image pickup element with an ideal image captured by an ideal image pickup element, to inspect the image pickup element,
to function as the inspection unit configured to compare the image captured by the image pickup element with the ideal image captured by the ideal image pickup element, to inspect the image pickup element.

REFERENCE SIGNS LIST

110 Inspection apparatus
111 Collimated-light emission unit
112 Transmission filter
113, 113' Image pickup element 114 Connection
115 Substrate
115a Connector
116 Comparison unit
117 Performance determination unit
121 Lens
122 CSP solid-state image pickup element
142 Glass substrate
143 Fixing material
221 Circuit board
221a Spacer
221b Connector
231 Lens

The invention claimed is:

1. An inspection apparatus, comprising:
 a collimated-light emitter configured to generate collimated light;
 a transmission filter configured to transmit a first part of the collimated light and block a second part of the collimated light different from the first part of the collimated light;
 an image pickup element configured to capture an image including the first part of the collimated light transmitted by the transmission filter; and
 a central processing unit (CPU) configured to compare the image captured by the image pickup element with an ideal image captured by an ideal image pickup element, to inspect the image pickup element.

2. The inspection apparatus according to claim 1, further comprising a connection connected with the image pickup element,
 wherein the connection is configured to output the image including a pixel signal captured by the image pickup element, to the CPU.

3. The inspection apparatus according to claim 1, wherein
 the image pickup element is connected with a circuit board of an image pickup device, and
 the image including a pixel signal captured by the image pickup element is output to the CPU through the circuit board.

4. The inspection apparatus according to claim 1, wherein the image pickup element includes a chip size package (CSP) solid-state image pickup element configured to capture an image including a pixel signal corresponding to a quantity of incident light.

5. The inspection apparatus according to claim 1, wherein the CPU is further configured to:
 calculate a difference between the image captured by the image pickup element and the ideal image captured by the ideal image pickup element; and
 compare the calculated difference with a specific threshold, to inspect the image pickup element.

6. The inspection apparatus according to claim 5, wherein the CPU is further configured to calculate a sum of difference absolute values in pixel value between pixels of the image captured by the image pickup element and the ideal image captured by the ideal image pickup element.

7. The inspection apparatus according to claim 1, wherein the transmission filter includes:
 a flat face including a light-blocking face, and
 holes arranged regularly on the light-blocking face, and
 the holes allow for allowing the collimated light to be transmitted.

8. The inspection apparatus according to claim 7, wherein the holes on the light-blocking face of the transmission filter are one of circular, quadrangular, or triangular in shape.

9. The inspection apparatus according to claim 7, wherein the holes on the light-blocking face of the transmission filter are linear in shape or are in a grid pattern.

10. The inspection apparatus according to claim 1, wherein the image pickup element includes:
 a chip size package (CSP) solid-state image pickup element configured to capture an image including a pixel signal corresponding to a quantity of incident light, and
 a lens configured to condense the incident light to the CSP solid-state image pickup element.

11. The inspection apparatus according to claim 10, wherein
 the lens is a lower lens that is a first part of a lens group of a first plurality of lenses,
 the first plurality of lenses condenses received light,
 the lens is on a front side of the image pickup element,
 the lens is closer to the image pickup element than an upper lens, and
 the upper lens is a second part of the lens group different from the first part of the lens group.

12. The inspection apparatus according to claim 11, wherein the lower lens includes a second plurality of lenses.

13. The inspection apparatus according to claim 10, further comprising a light-absorbing material configured to absorb specific light, wherein
 the light-absorbing material covers a side face of the image pickup element and an outer circumferential portion of the lens,
 the image captured by the image pickup element corresponds to a region of the image pickup element different from an insensitive region of the image pickup element, and
 the CPU is further configured to compare the image captured by the image pickup element corresponding to the region with the ideal image captured by the ideal image pickup element, to inspect the image pickup element.

14. An inspection method, comprising:
 generating collimated light;
 transmitting a first part of the collimated light;
 blocking a second part of the collimated light different from the first part of the collimated light, wherein an image pickup element captures an image of the transmitted first part of the collimated light; and
 comparing the image captured by the image pickup element with an ideal image captured by an ideal image pickup element, to inspect the image pickup element.

15. A non-transitory computer-readable medium having stored thereon computer-executable instructions which, when executed by a computer, cause the computer to execute operations, the operations comprising:
 controlling a collimated-light emitter to generate collimated light;
 controlling a transmission filter to transmit a first part of the collimated light and block a second part of the collimated light different from the first part of the collimated light;
 controlling an image pickup element to capture an image including the first part of the collimated light transmitted by the transmission filter; and
 comparing the image captured by the image pickup element with an ideal image captured by an ideal image pickup element, to inspect the image pickup element.

* * * * *